United States Patent
Han et al.

(10) Patent No.: US 7,598,168 B2
(45) Date of Patent: Oct. 6, 2009

(54) METHOD OF FABRICATING DUAL DAMASCENE INTERCONNECTION AND ETCHANT FOR STRIPPING SACRIFICIAL LAYER

(75) Inventors: Sang-cheol Han, Seoul (KR); Kyoung-woo Lee, Seoul (KR); Mi-young Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 733 days.

(21) Appl. No.: 11/033,208

(22) Filed: Jan. 11, 2005

(65) Prior Publication Data

US 2005/0176243 A1 Aug. 11, 2005

(30) Foreign Application Priority Data

Feb. 6, 2004 (KR) .................. 10-2004-0008065

(51) Int. Cl.
*H01L 21/4763* (2006.01)
*H01L 21/461* (2006.01)

(52) U.S. Cl. .............................. 438/637; 257/E21.251; 257/E21.255; 257/E21.301; 257/E21.579; 438/745

(58) Field of Classification Search .......... 257/E21.251, 257/E21.255, E21.301, E21.579; 438/637, 438/745
See application file for complete search history.

(56) References Cited

U.S. PATENT DOCUMENTS

| 4,517,106 | A | * | 5/1985 | Hopkins et al. ............ | 252/79.4 |
| 6,057,239 | A | | 5/2000 | Wang et al. ................. | 438/689 |
| 6,297,149 | B1 | * | 10/2001 | Stamper ..................... | 438/637 |
| 6,297,178 | B1 | * | 10/2001 | Berbner et al. ............. | 442/302 |
| 6,797,194 | B1 | | 9/2004 | Kikuyama et al. ......... | 252/79.1 |
| 6,828,229 | B2 | | 12/2004 | Lee et al. .................... | 438/638 |

FOREIGN PATENT DOCUMENTS

| KR | 00-43051 | 7/2000 |
| KR | 10-2001-0040961 | 5/2001 |
| KR | 02-56009 | 7/2002 |
| KR | 10-2002-0085722 | 11/2002 |

* cited by examiner

*Primary Examiner*—Asok K Sarkar
(74) *Attorney, Agent, or Firm*—Mills & Onello, LLP

(57) ABSTRACT

A method of forming a dual damascene semiconductor interconnection and an etchant composition specially adapted for stripping a sacrificial layer in a dual damascene fabrication process without profile damage to a dual damascene pattern are provided. The method includes sequentially forming a first etch stop layer, a first intermetal dielectric, a second intermetal dielectric, and a capping layer on a surface of a semiconductor substrate on which a lower metal wiring is formed; etching the first intermetal dielectric, the second intermetal dielectric, and the capping layer to form a via; forming a sacrificial layer within the via; etching the sacrificial layer, the second intermetal dielectric, and the capping layer to form a trench; removing the sacrificial layer remaining around the via using an etchant composition including $NH_4F$, $HF$, $H_2O$ and a surfactant; and forming an upper metal wiring within the thus formed dual damascene pattern including the via and the trench. The preferred etchant composition for stripping a sacrificial layer in the foregoing dual damascene process consists essentially of $NH_4F$, $HF$, $H_2O$ and a surfactant.

25 Claims, 6 Drawing Sheets

METHOD OF FABRICATING DUAL DAMASCENE INTERCONNECTION AND ETCHANT FOR STRIPPING SACRIFICIAL LAYER

This application claims priority of Korean Patent Application No. 10-2004-0008065 filed on Feb. 6, 2004 in the Korean Intellectual Property Office, the disclosure of which is incorporated herein in its entirety by reference.

BACKGROUND OF THE INVENTION

1. Field of the Invention

The present invention relates to a method of manufacturing a semiconductor device, and more particularly, to a method of fabricating a dual damascene interconnection capable of efficiently forming a dual damascene structure having a high aspect ratio especially well suited for applications in highly integrated semiconductor devices without a profile failure. The present invention also relates to an etchant composition for stripping a sacrificial layer in performing a dual damascene process such as in the present invention.

2. Description of the Related Art

With rapid progress and development in the techniques available to produce high-speed, highly-integrated logic devices, new techniques for fabrication of miniaturized transistors have been developed. As the integration level of the transistors has increased, interconnections have become smaller and smaller. As a result, a problem of interconnection delay may become more serious and result in impeding attainment of high-speed logic devices.

Under such a situation, instead of using an aluminum alloy, which has been conventionally and generally used in interconnecting large scale integrated (LSI) semiconductor devices, interconnections using copper, which has the properties of lower resistance and higher electromigration (EM) tolerance as an interconnection material, have been actively developed. However, there are also problems with this approach in that copper is not easy to etch and is prone to oxidation. Accordingly, a damascene process is necessarily employed to form a copper interconnection.

The damascene process is a filling process that typically includes the steps of forming a trench having an upper interconnection formed on an insulating layer, forming a via that connects the upper interconnection to a lower interconnection or to a substrate such that the trench is aligned over the via, filling the trench and the via with copper, and finally planarizing by a chemical mechanical polishing (CMP) process.

Moreover, the use of an insulating layer with a low dielectric constant (hereinafter, referred to as a low-k dielectric) and the copper interconnection reduce parasitic capacitance between interconnections, thereby increasing the speed of the resulting semiconductor devices and reducing crosstalk of the semiconductor devices. At present, development of a variety of low-k dielectrics useful in such applications is under way. The low-k dielectrics are largely divided into $SiO_2$-based inorganic polymers and C-based organic polymers.

Because the strength of the low-k dielectric is typically relatively low, it is likely that the low-k dielectric will be denatured during a process step subsequent to the dual damascene process. Accordingly, a capping layer may be formed on top of the low-k dielectric in order to prevent the denaturation of the low-k dielectric.

A dual damascene process may be employed in forming bit lines or word lines in addition to metal wirings. In particular, in the dual damascene process, vias for connecting an upper metal wiring to a lower metal wiring in a multi-layered metal wiring structure can be formed at the same time. Further, utilizing a dual damascene process facilitates certain process steps subsequent to the dual damascene process because a step difference caused by the metal wiring is removed during the dual damascene process.

A dual damascene process may be either a via-first process or a trench-first process. In the via-first process, a via is first formed by etching a dielectric by photography and etching, and a trench is then formed on top of the via by further etching of the dielectric. In the trench-first process, on the other hand, the trench is first formed and the via is then formed. Of these two approaches, the via-first process is used more often.

A method of forming an interconnection using a dual damascene process is disclosed in U.S. Pat. No. 6,057,239, which patent is incorporated herein by reference. In U.S. Pat. No. 6,057,239, hydrogen silsesquioxane (HSQ) or SOG is used as a sacrificial layer for etching a trench using an oxide layer as an intermetal dielectric. Also, in the disclosed patent, a method of removing the remaining HSQ or SOG after etching a trench using buffered-oxide etch (BOE) or hydrofluoric (HF) solution is described. However, BOE or HF solution can easily penetrate into an interface between a capping layer for preventing deformation of the intermetal dielectric and the intermetal dielectric disposed under the capping layer so that an undercut is thereby generated and the capping layer is lifted up damaging the semiconductor device.

FIG. 1 is a scanning electron microscope (SEM) image photograph showing a capping layer (identified as CAP) and an intermetal dielectric (IMD) after a step of wet etching a sacrificial layer such as HSQ using HF solution. As shown in FIG. 1, an undercut having a size of about 300-400 Å is generated under the capping layer CAP by wet etching the intermetal dielectric IMD (for example HSQ) using HF solution. Also, it can be observed that the intermetal dielectric IMD was inwardly etched and curved at the lower portion of the undercut by wet etching using HF solution. Some prior art in the field, such as U.S. Pat. No. 6,297,149, which patent is incorporated herein by reference, teaches depositing a protective barrier layer within a via after via formation and prior to filling the via with a sacrificial material so as to prevent lateral etching of the via during removal of sacrificial material. It is difficult, however, to deposit an effective diffusion barrier metal or a seed layer on a sidewall of a via or a trench for performing a damascene process in the inwardly curved portion of the intermetal dielectric IMD using any conventional deposition techniques.

These and other problems with and limitations of the prior art technologies in this field are addressed in whole or at least in part by the methods and compositions of this invention.

SUMMARY OF THE INVENTION

To solve the above-described problems, it is a general object of the present invention to provide a new and improved method of forming a dual damascene interconnection, in which a profile of a dual damascene pattern is not damaged even after a sacrificial layer remaining around a via is removed after forming a trench.

Another object of the present invention to provide an etchant composition specially adapted for stripping a sacrificial layer, in which a profile of a dual damascene pattern is not damaged, even after a sacrificial layer remaining around a via is removed after forming a trench.

To accomplish the above and other objects of the present invention, this invention provides a method of forming a dual damascene interconnection comprising the following steps: sequentially forming a first etch stop layer, a first intermetal dielectric, a second intermetal dielectric, and a capping layer on a surface of a semiconductor substrate on which a lower metal wiring is formed; etching the first intermetal dielectric, the second intermetal dielectric, and the capping layer, and forming a via; forming a sacrificial layer within the via, etching the sacrificial layer, the second intermetal dielectric, and the capping layer, and forming a trench aligned over the via; removing the sacrificial layer remaining around the via preferably using an etchant composition that includes $NH_4F$, HF, $H_2O$ and a surfactant; and forming an upper metal wiring within a dual damascene pattern that includes the via and the trench.

According to another aspect of the present invention, this invention provides a method of forming a dual damascene interconnection comprising the following steps: sequentially forming a first etch stop layer, a first intermetal dielectric, a second intermetal dielectric made of SiOC:H, and an USG (undoped silica glass; $SiO_2$) capping layer on top of a semiconductor substrate on which a lower metal wiring is formed; etching the first intermetal dielectric, the second intermetal dielectric, and the capping layer, and forming a via; forming a HSQ sacrificial layer within the via; etching the sacrificial layer, the second intermetal dielectric, and the capping layer, and forming a trench; removing the sacrificial layer remaining around the via using an etchant composition that includes $NH_4F$, HF, $H_2O$ and a surfactant; and forming an upper metal wiring within a dual damascene pattern including the via and the trench.

According to still another aspect of the present invention, there is provided an etchant composition for stripping a sacrificial layer in a dual damascene process, said etchant composition consisting essentially of $NH_4F$, HF, $H_2O$ and a surfactant.

BRIEF DESCRIPTION OF THE DRAWINGS

The above objects and advantages of the present invention will become more apparent by the following detailed description of preferred embodiments thereof with reference to the attached drawings in which.

DETAILED DESCRIPTION OF THE INVENTION

Figure 1:
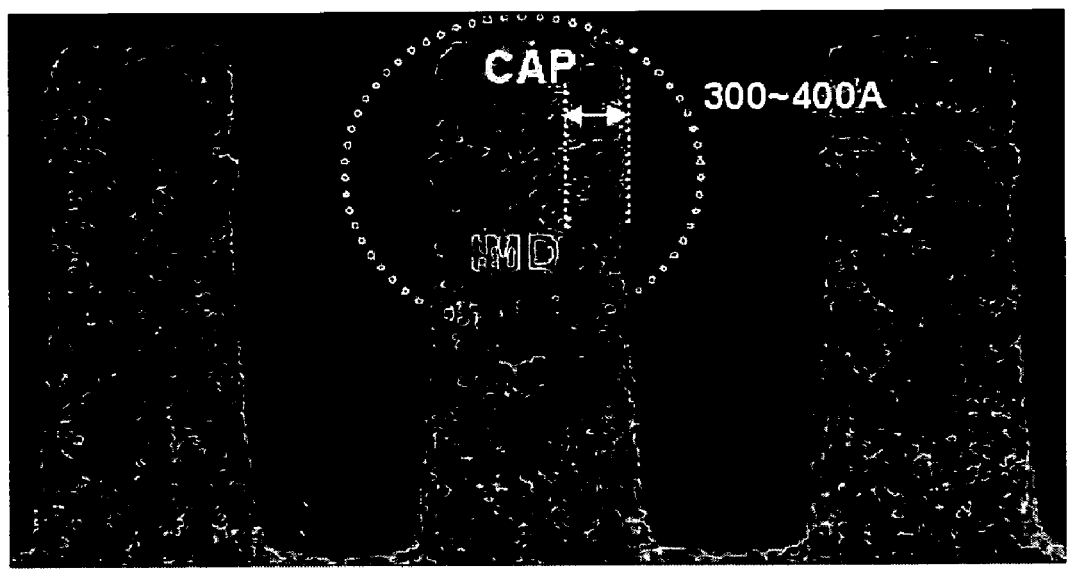
FIG. 1 is a scanning electron microscope (SEM) image photograph showing a capping layer and an intermetal dielectric after wet etching a sacrificial layer using HF solution.

The present invention now will be described more fully with reference to the accompanying drawings, in which preferred embodiments of the invention are shown. It will be understood that this invention may, however, be embodied in many different forms and should not be construed as being limited to the embodiments set forth herein; rather, these embodiments are provided so that this disclosure will be thorough and complete, and will fully convey the concept of the invention to those skilled in the art. The spirit and scope of the invention is defined by the appended claims. In the drawings, the same reference numerals denote the same member or element of the semiconductor device.

Hereinafter, a first embodiment of the present invention is described in reference to FIGS. 2A through 2F, which are cross-sectional views of a portion of a semiconductor device illustrating steps in carrying out a dual damascene process according to a first embodiment of the present invention.

Figure 2A:
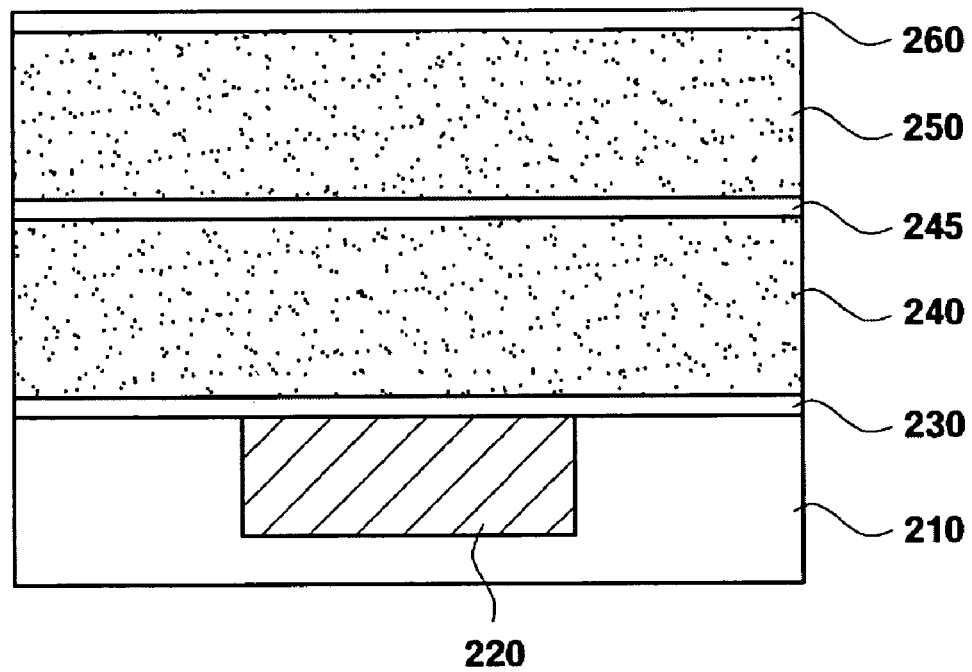
FIGS. 2A through 2F are cross-sectional views of a portion of a semiconductor device illustrating steps in carrying out a dual damascene process according to a first embodiment of the present invention.

Referring to FIG. 2A, a first etch stop layer 230, a first intermetal dielectric (IMD) 240, a second intermetal dielectric 250, and a capping layer 260 are formed in this order on a surface of a semiconductor substrate 210, along which surface a lower metal wiring 220 is formed. A second etch stop layer 245 can be selectively formed between the first IMD 240 and the second IMD 250 according to an embodiment of the invention.

Figure 2B:
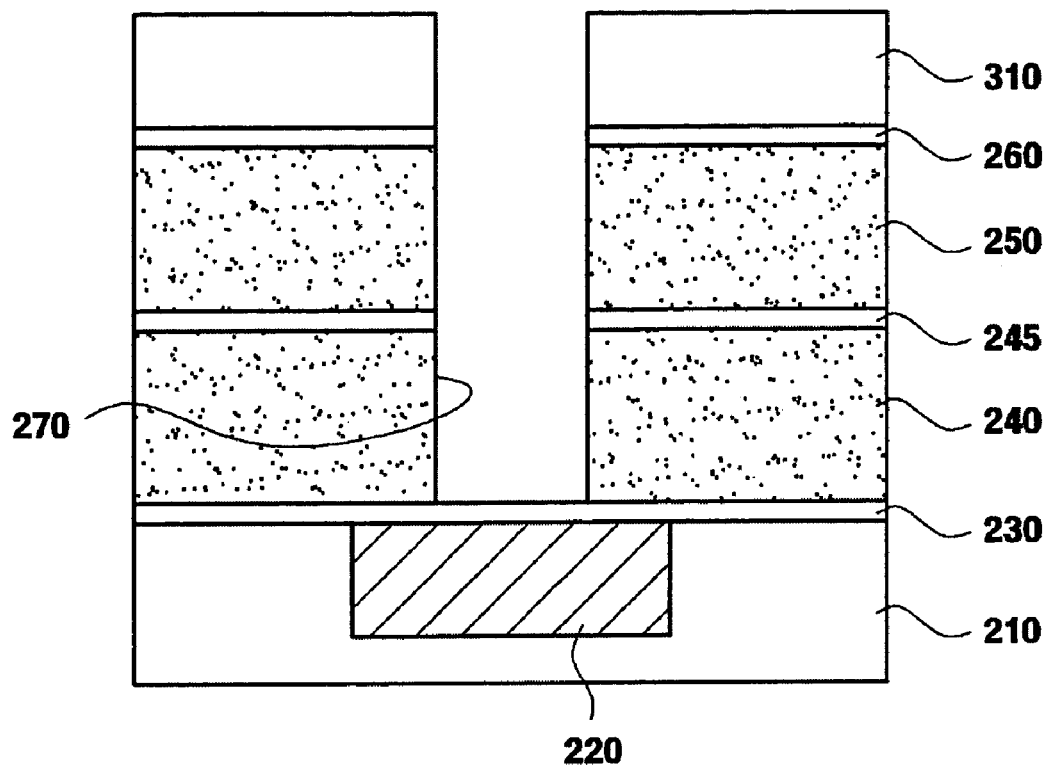
Figure 2C:
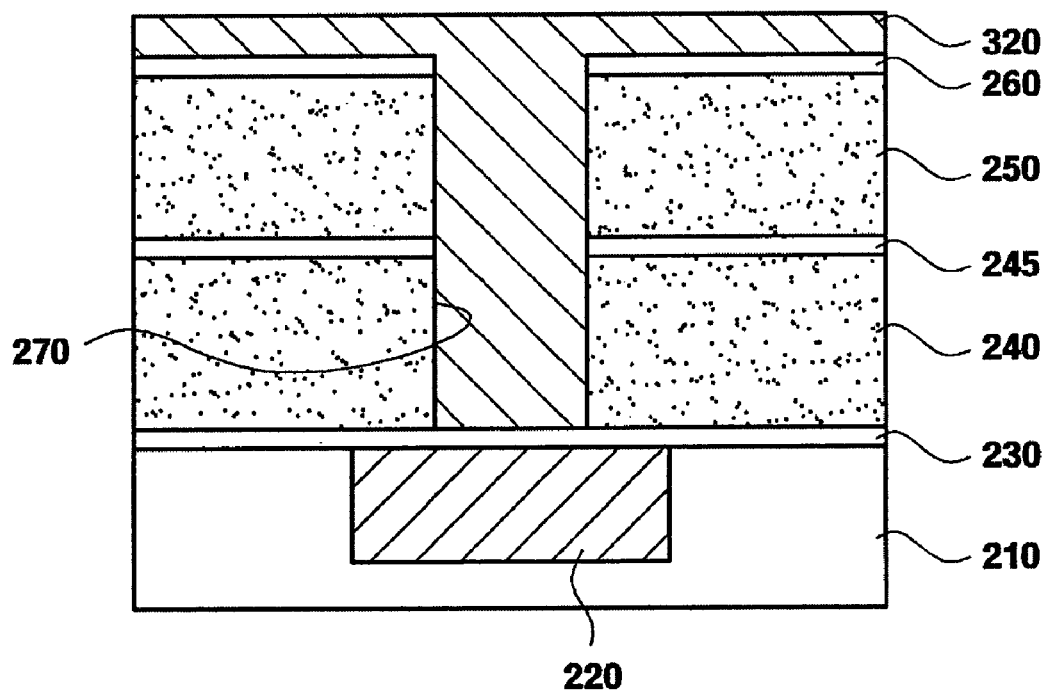
Figure 2D:
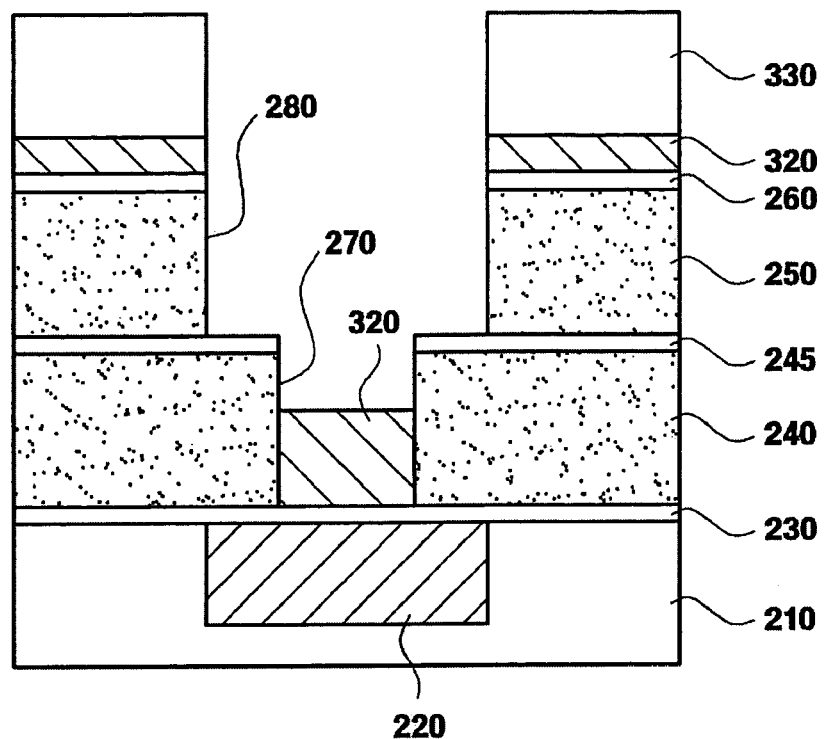

The first IMD 240 and the second IMD 250 each have sufficient thickness to form respectively a via (e.g., via 270 shown in FIG. 2D) and a trench (e.g., trench 280 shown in FIG. 2D). Further, the first IMD 240 and the second IMD 250 are preferably formed of an organic polymer having a low dielectric constant (low-k), a material consisting essentially of a material selected from doped oxide series materials, or similar materials. Examples of doped oxide series materials include fluorine-doped oxide (FSG), carbon-doped oxide, silicon oxide, hydrogen silsesquioxane (HSQ) (SiO:H), methyl silsesquioxane (MSQ) ($SiO:CH_3$) or a-SiOC (SiOC:H), and similar materials. Examples of organic polymers having a low-k include polyarylether-based resin, annular fluorine resin, siloxane copolymer, polyarylether-based fluoride resin, polypentafluorostylene, polytetrafluorostylene-based resin, polyimide fluoride resin, polynaphthalene fluoride, polycide resin, and similar materials. IMD 240 and IMD 250 can be formed using a plasma enhanced chemical vapor deposition (PECVD) process, a high-density plasma-CVD (HDP-CVD) process, an atmospheric pressure CVD (APCVD) process, a spin coating process, or similar material layer formation methods.

Capping layer 260 can be formed of a material consisting essentially of $SiO_2$, SiOF, SiON, SiC, SiN, SiCN or a material consisting essentially of a combination thereof.

The first etch stop layer 230 and the second etch stop layer 245 can be formed of a material consisting essentially of SiN, SiON, SiC/N-series material, boron nitride (BN) or a material consisting essentially of a combination thereof. The first etch stop layer 230 can be used as not only an etch stop layer but also as a copper diffusion barrier metal in an embodiment wherein the lower metal wiring element 220 along a surface of the semiconductor substrate 210 is made of copper.

Referring FIG. 2B, a first photoresist layer 310 having an opening with a pattern corresponding to that of the desired via 270 is formed on the capping layer 260. Subsequently, the first IMD 240, the second etch stop layer 245, the second IMD 250, and the capping layer 260 are etched until a surface of the first etch stop layer 230 is exposed. During this etching step, the first photoresist layer 310 serves as an etch mask so that the via 270 (as shown in FIG. 2D) is formed.

Referring FIG. 2C, following the etching step the first photoresist layer 310 has been removed by an ashing process. Thereafter, a sacrificial layer 320 is formed within the via 270 formed in the first IMD 240, the second etch stop layer 245, the second IMD 250, and the capping layer 260. The sacrificial layer 320 is formed to cover an inner portion of the via 270 and an upper (surface) portion of the capping layer 260. The sacrificial layer 320 can be formed of HSQ or SOG as previously described.

In an embodiment where the first IMD 240 and the second IMD 250 are made of a low-k dielectric material, etching selectivity between the IMDs (240 and 250) and the first etch stop layer 230 located under the via 270 is relatively low such that, in an etch process for forming a trench (described in connection with FIG. 2D), the first etch stop layer 230 located under the via 270 is etched early, resulting also in etching the lower metal wiring 220 located under the first etch stop layer 230. Etching of metal wiring 220 should usually be avoided. In order to prevent the lower metal wiring 220 from being etched during this process step, the via 270 is filled with the sacrificial layer 320 as described above.

Referring to FIG. 2D, a second photoresist layer 330 having an opening with a pattern corresponding to that of the desired trench 280 is formed on top of the sacrificial layer 320. The second photoresist layer 330 is then formed so as to overlap the via 270 with the trench 280. Subsequently, the second IMD 250, the capping layer 260, and the sacrificial layer 320 are etched until a surface of the second etch stop layer 245 is exposed. During this etching step, the second photoresist layer 330 serves as an etch mask so that the trench 280 is formed. Thereafter, the second photoresist layer 330 is removed by an ashing process.

As shown in FIG. 2D, after forming the trench 280, portions of the sacrificial layer 320 remain within the via 270 of the first IMD 240 as well as along the upper portion (surface) of the capping layer 260.

Figure 2E:
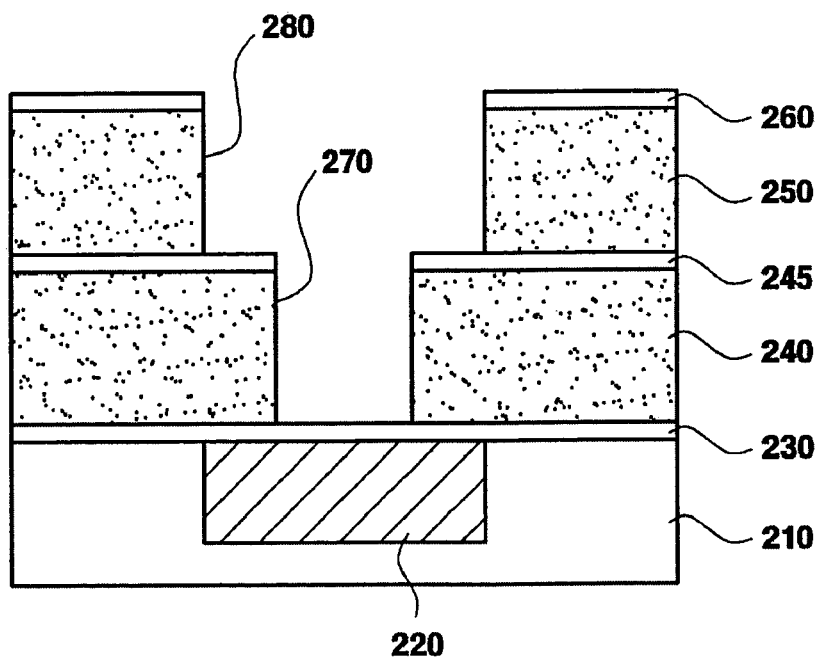

Referring to FIG. 2E, the portions of sacrificial layer 320 remaining within the via 270 of the first IMD 240 and along the upper portion of the capping layer 260 are removed using an etchant selected for stripping a sacrificial layer. A suitable etchant for stripping the sacrificial layer 320 in accordance with this invention consists essentially of HF, $NH_4F$, $H_2O$ and a surfactant.

In the above-described etchant composition for removing sacrificial layer 320, HF serves to etch the sacrificial layer 320, while $NH_4F$ serves as a buffer, that is, it is dissociated into $HF^{2-}$ or $HF^-$ to control the amount of HF. The surfactant is mainly comprised of a large-size, polymer-series material. It is believed that, while the sacrificial layer 320 is being removed by the etchant for stripping the sacrificial layer, the surfactant in the etchant composition is being absorbed into a surface region of the structure which has been formed on the semiconductor substrate 210, especially, into exposed surfaces of the second IMD 250 and the capping layer 260, thereby preventing the etchant for stripping the sacrificial layer from penetrating into an interface between the second IMD 250 and the capping layer 260. Thus, it has been found in accordance with this invention that the surface absorption of such surfactant can minimize or substantially prevent an undercut from being generated at a lower portion of the capping layer 260 due to penetration of the etchant during this step of the process.

Examples of suitable surfactants for inclusion in the etchant composition as described above include perfluoroalkyl ethylene oxide, perfluoroalkyl amine oxide, perfluoroalkyl containing complexes, ammonium perfluoroalkyl sulfonates, potassium perfluoroalkyl sulfonates, amine perfluoroalkyl sulfonates, perfluoroalkyl sulfonates, sodium salts, potassium fluoroalkyl carboxylates, lithium perfluorooctane sulfonates, ammonium perfluoroalkyl sulfonates, fluorinated alkyl quaternary ammonium iodides, fluorinated alkyl polyoxethylenes, fluorinated alkyl alkoxylates, ammonium perfluoroalkyl carboxylates, fluoroaliphatic polymeric esters, alkylaryl polyether alcohol, polymer of ethylene oxide andnonylphenol, polymers of ethylene oxide and 2,6,8-trimethyl-4-nonanol, polymers of ethylene oxide and propylene oxide, R—O—S(=O)$_2$—ONa (wherein R is selected from tetradecyl, heptadecyl and 2-ethylhexyl groups), R—O—($C_2H_4O$)x-H, $RfCH_2CH_2SCH_2CH_2CO_2Li$ (wherein Rf is a $F(CF_2CF_2)_{3\sim8}$ group), $(RfCH_2CH_2O)PO(ONH_4)_2$ (wherein Rf is a $F(CF_2CF_2)_{3\sim8}$ group), $(RfCH_2CH_2O)PO(ONH_4)$ (wherein Rf is a $F(CF_2CF_2)_{3\sim8}$ group), $(RfCH_2CH_2O)PO(OH)_2$ (wherein Rf is a $F(CF_2CF_2)_{3\sim8}$ group), $RfCH_2CH_2O(CH_2CH_2O)xH$ (wherein Rf is a $F(CF_2CF_2)_{3\sim8}$ group), $RfCH_2CH_2SO_3X$ (wherein X is a H or $NH_4$ group and Rf is a $F(CF_2CF_2)_{3\sim8}$ group), $CF_3(CF_2)_7(CH_2CH_2O)_{15}SO_2NHOH$, $RfSO_2N(C_2H_5)(CH_2CH_2O)xH$ (wherein N is 8 and Rf is a CnF2n+ group), $RfSO_2N(C_2H_5)(CH_2CH_2O)xH$ (wherein Rf is a $F(CF_2CF_2)y$ group), or combinations and mixtures of two or more of these compounds.

It is preferable that the etchant composition in accordance with this invention for stripping the sacrificial layer consist essentially of about 5-25 wt % of $NH_4F$, about 0.01-3 wt % of HF, about 70-95 wt % of $H_2O$, and about 0.1-5 wt % of a surfactant as described above. In general, it ha been found that when the surfactant is present in the etchant composition in an amount of less than about 0.1 wt %, it cannot effectively prevent the etchant from penetrating into an interface between the second IMD 250 and the capping layer 260. Further, it has been found that when the surfactant is contained in an amount greater than about 5 wt %, bubbles may be generated in the etchant so that the etching of the sacrificial layer 320 cannot be performed smoothly. Accordingly, it is preferable that the surfactant is present in the etchant in an amount of about 0.1-5 wt %.

Since the sacrificial layer 320 is highly reactive with the etchant at a temperature of about 20-80° C., it is preferable that a process for removing the sacrificial layer 320 be performed in the temperature range of about 20-80° C.

Figure 2F:
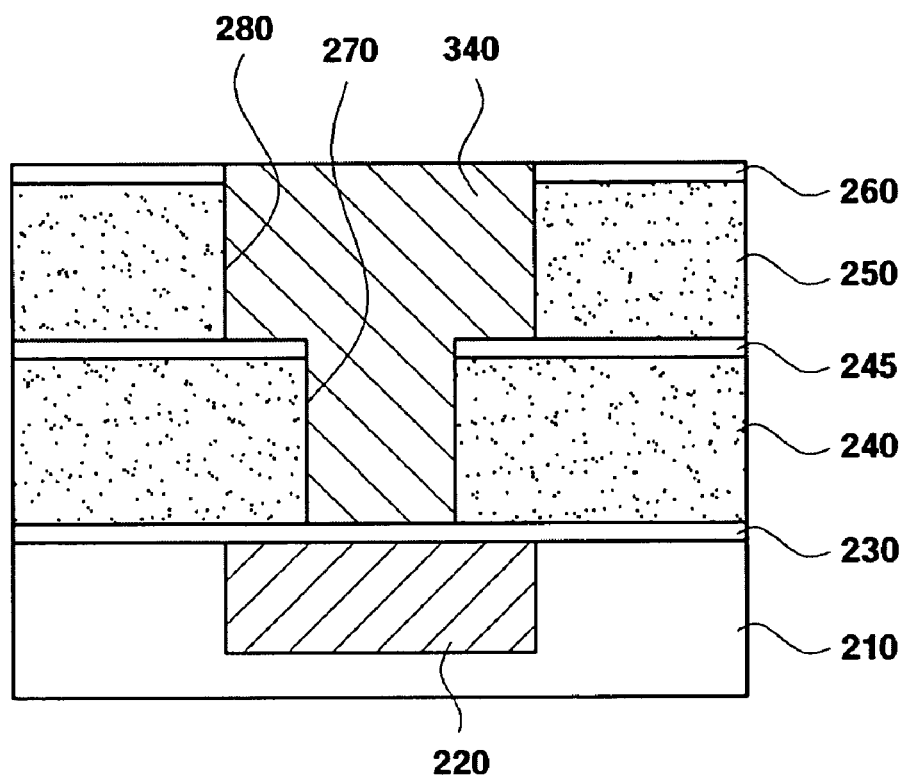

Referring to FIG. 2F, in another step an upper metal wiring 340 is formed within the via 270 and the trench 280 by a damascene process. The upper metal wiring 340 may be formed of any member selected from the group consisting of Al, an Al alloy, Cu, Au, Ag, W and Mo. The upper metal wiring 340 can be formed by any appropriate method such as sputtering followed by reflow, chemical vapor deposition (CVD), and electroplating. In the case of using an electroplating method, it is typically necessary to form a seed layer through which a current can flow during electrolysis.

In another invention embodiment, prior to forming the upper metal wiring 340, a diffusion barrier metal (not shown) may be further formed. Particularly if copper is used in the damascene process, the use of a diffusion barrier metal is useful in preventing degradation of an insulation characteristic of the IMD caused by diffusion of copper conductive material. The diffusion barrier metal may be at least one member selected from the group consisting of Ta, TaN, TiN, WN, TaC, WC, TiSiN and TaSiN. The diffusion barrier metal can be formed by a method selected from the group consisting of PVD, CVD and atomic layer deposition (ALD) processes.

FIGS. 3A through 3D are SEM image photographs showing the capping layer and the intermetal dielectric after the sacrificial layer has been removed using an etchant composition for stripping the sacrificial layer according to an earlier-described embodiment of the present invention. In the illustrative embodiment used for FIGS. 3A-3D, SiC is used as the first etch stop layer 230 and as the second etch stop layer 245; SIOC:H is used as the first intermetal dielectric 240 and as the second intermetal dielectric 250; USG (undoped silica glass; $SiO_2$) is used as the capping layer 260; and HSQ is used as the sacrificial layer 320. The etchant for stripping the sacrificial layer consists essentially of about 19 wt % of $NH_4F$, about 2 wt % of HF, about 79 wt % of $H_2O$ and about 0.1-5 wt % of surfactant. For this illustration, polymer including ethylene oxide, particularly, an NCW1004™ surfactant manufactured by Wako Chemical Co. Ltd., is used as the surfactant.

Figure 3A:
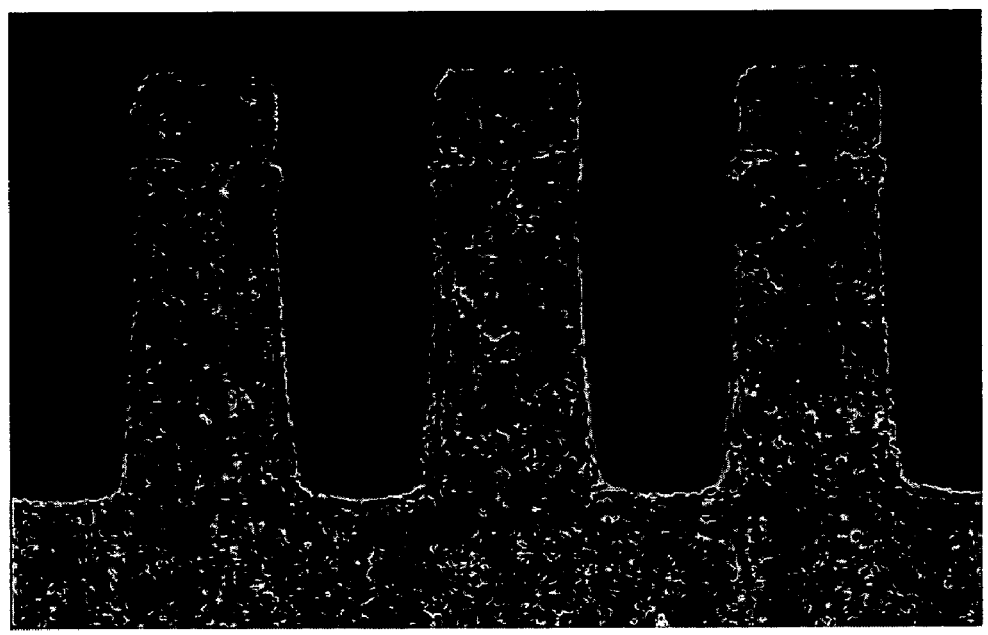
FIGS. 3A through 3D are SEM image photographs showing a capping layer and an intermetal dielectric after removing a sacrificial layer using BOE solution adding a surfactant according to the first embodiment of the present invention.
Figure 3B:
Figure 3C:
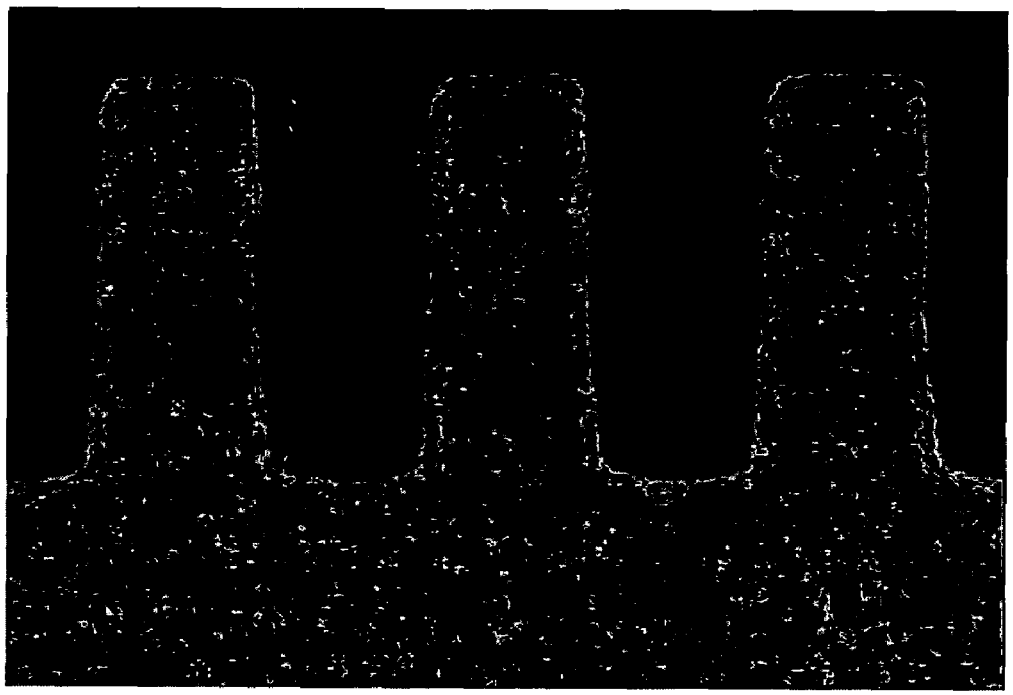
Figure 3D:

FIG. 3A shows the etching results when the NCW1004 surfactant is used in an amount of less than 0.1 wt %, which is below the range required according to this invention. FIG. 3B shows the etching results when the NCW1004 surfactant is used in an amount of 0.1 wt %, just at the low end of the range required according to this invention. FIG. 3C shows the etching results when the NCW1004 surfactant is used in an amount of 5.0 wt %, just at the high end of the range required according to this invention. FIG. 3D shows the etching results when the NCW1004 surfactant is used in an amount of greater than 5.0 wt %, which is above the range required according to this invention. Lengths of the undercut formed under the capping layer 260 were measured using the SEM image photographs shown in FIGS. 3A through 3D. The measurement results showed that the undercut shown in FIG. 3A is 400 Å long; the undercut shown in FIG. 3B is 200 Å long; the undercut shown in FIG. 3C is 150 Å long; and the undercut shown in FIG. 3D is 190 Å long.

It can be understood from FIGS. 3A through 3D that, in accordance with this invention, the concentration of the surfactant contained in the etchant composition has been found to be optimized in the recited range. Accordingly, the concentration of the surfactant is preferably in a range of about 0.1-5 wt % of the etchant composition for embodiments of this invention.

Compared with the prior art embodiment shown in FIG. 1, according to the present invention, as shown in FIGS. 3A through 3D, by using the etchant composition for stripping the sacrificial layer, the length of the undercut formed at the interface between the capping layer and the intermetal dielectric can be significantly reduced. Also, since there is no inward curve at the lower portion of the undercut when using an etchant composition in accordance with this invention, the diffusion barrier metal and the seed layer can be uniformly deposited throughout sidewalls of the via and/or the trench. This is another important advantage of the present invention.

Also as described above, in accordance with the method of forming the dual damascene interconnection using the etchant composition for stripping the sacrificial layer according to the present invention, the metal wiring can be formed by removing the sacrificial layer remaining around the via without profile damage to a dual damascene pattern.

An electrical test was conducted on a semiconductor device manufactured according to the first described embodiment of the present invention. The test results confirmed that sheet resistance Rs for the upper metal wiring 340 and contact resistance Rc for the via 270 were excellent.

While the present invention has been particularly shown and described through exemplary embodiments thereof with reference to the accompanying drawings, it will be understood by those of ordinary skill in the art that various changes in form and details may be made therein without departing from the spirit and scope of the present invention as defined by the following claims.

Having described the invention, what is claimed is:

1. A method of forming a dual damascene interconnection comprising the ordered steps of:
   (a) sequentially forming on a surface of a semiconductor substrate on which a lower metal wiring is formed a first etch stop layer, a first intermetal dielectric, a second intermetal dielectric, and a capping layer;
   (b) etching the first intermetal dielectric, the second intermetal dielectric, and the capping layer to form a via;
   (c) forming a sacrificial layer of HSQ or SOG within the via, wherein said HSQ or SOG sacrificial layer is a different material than the first intermetal dielectric, the second intermetal dielectric, or the capping layer;
   (d) etching the sacrificial layer, the second intermetal dielectric, and the capping layer to form a trench;
   (e) removing portions of the sacrificial layer remaining within the via and on the capping layer using an etchant composition consisting essentially of $NH_4F$, $HF$, $H_2O$ and a surfactant; and,
   (f) forming an upper metal wiring within a dual damascene pattern including the via and the trench.

2. The method of claim 1, wherein the surfactant consists essentially of a material selected from the group consisting of perfluoroalkyl ethylene oxide, perfluoroalkyl amine oxide, perfluoroalkyl containing complexes, ammonium perfluoroalkyl sulfonates, potassium perfluoroalkyl sulfonates, amine perfluoroalkyl sulfonates, perfluoroalkyl sulfonates, sodium salts, potassium fluoroalkyl carboxylates, lithium perfluorooctane sulfonates, ammonium perfluoroalkyl sulfonates, fluorinated alkyl quaternary ammonium iodides, fluorinated alkyl polyoxethylenes, fluorinated alkyl alkoxylates, ammonium perfluoroalkyl carboxylates, fluoroaliphatic polymeric esters, alkylaryl polyether alcohol, polymer of ethylene oxide and nonylphenol, polymers of ethylene oxide and 2,6,8-trimethyl-4-nonanol, polymers of ethylene oxide and propylene oxide, R—O—S(=O)$_2$—ONa (wherein R is selected from tetradecyl, heptadecyl and 2-ethylhexyl groups), R—O—$(C_2H_4O)$x-H, $RfCH_2CH_2SCH_2CH_2CO_2Li$ (wherein Rf is a $F(CF_2CF_2)_{3\sim8}$ group), $(RfCH_2CH_2O)PO(ONH_4)_2$ (wherein Rf is a $F(CF_2CF_2)_{3\sim8}$ group), $(RfCH_2CH_2O)PO(ONH_4)$ (wherein Rf is a $F(CF_2CF_2)_{3\sim8}$ group), $(RfCH_2CH_2O)PO(OH)_2$ (wherein Rf is a $F(CF_2CF_2)_{3\sim8}$ group), $RfCH_2CH_2O(CH_2CH_2O)xH$ (wherein Rf is a $F(CF_2CF_2)_{3\sim8}$ group), $RfCH_2CH_2SO_3X$ (wherein X is a H or $NH_4$ group and Rf is a $F(CF_2CF_2)_{3\sim8}$ group), $CF_3(CF_2)_7(CH_2CH_2O)_{15}SO_2NHOH$, $RfSO_2N(C_2H_5)(CH_2CH_2O)xH$ (wherein N is 8 and Rf is a CnF2n+ group), $RfSO_2N(C_2H_5)(CH_2CH_2O)xH$ (wherein Rf is a $F(CF_2CF_2)y$ group), and combinations of these compounds.

3. The method of claim 2, wherein the surfactant is present in the etchant composition in an amount of about 0.1-5 wt % based on the weight of the etchant composition.

4. The method of claim 3, wherein $NH_4F$ is present in the etchant composition in an amount of about 5-25 wt %, HF is present in the etchant composition in an amount of about 0.01-3 wt %, and $H_2O$ is present in the etchant composition in an amount of about 70-95 wt %.

5. The method of claim 2, wherein the capping layer consists essentially of a material selected from the group consisting of $SiO_2$, SiOF, SiON, SiC, SiN, SiCN and combinations and mixtures thereof.

6. The method of claim 2, wherein the first and/or the second intermetal dielectrics consist essentially of a material selected from the group consisting of fluorine-doped oxide (FSG), carbon-doped oxide, silicon oxide, methyl silsesquioxane (MSQ) or a-SiOC (SiOC:H), polyarylether-based resin, annular fluorine resin, siloxane copolymer, polyarylether-based fluoride resin, polypentafluorostylene, polytetrafluorostylene-based resin, polyimide fluoride resin, polynaphthalene fluoride, polycide resin, and combinations or mixtures thereof.

7. The method of claim 2, wherein the sacrificial layer is hydrogen silsesquioxane (HSQ).

8. The method of claim 2, further comprising the steps of forming a second etch stop layer between the first and second intermetal dielectrics before forming the second intermetal dielectric of the semiconductor.

9. The method of claim 8, wherein the first etch stop layer and/or the second etch stop layer consist essentially of a material selected from the group consisting of SiN, SiON, SiC/N-series material, boron nitride (BN), and combinations or mixtures thereof.

10. The method of claim 2, wherein the first etch stop layer consists essentially of a material selected from the group consisting of SiN, SiON, SiC/N-series material, boron nitride (BN), and combinations or mixtures thereof.

11. The method of claim 1, wherein $NH_4F$ is present in the etchant composition in an amount of about 5-25 wt %, HF is present in the etchant composition in an amount of about 0.01-3 wt %, the surfactant is present in the etchant composition in an amount of about 0.1-5 wt. %, and $H_2O$ is present in the etchant composition in an amount of about 70-95 wt %.

12. The method of claim 1, wherein the step of removing the sacrificial layer is performed at a temperature of about 20-80° C.

13. The method of claim 1, wherein $NH_4F$ is present in the etchant composition in an amount of about 19 wt %, HF is present in the etchant composition in an amount of about 2 wt %, the surfactant is present in the etchant composition in an amount of about 0.1-5 wt. %, and $H_2O$ is present in the etchant composition in an amount of about 79 wt %.

14. A method of forming a dual damascene interconnection comprising the ordered steps of:
(a) sequentially forming on a surface of a semiconductor substrate on which a lower metal wiring is formed a first etch stop layer, a first intermetal dielectric, a second intermetal dielectric made of SiOC:H, and an USG (un-doped silica glass; $SiO_2$) capping layer;
(b) etching the first intermetal dielectric, the second intermetal dielectric, and the capping layer to form a via and to expose sidewalls of the first intermetal dielectric, the second intermetal dielectric, and the capping layer;
(c) forming a HSQ sacrificial layer within the via such that the HSQ directly contacts the sidewalls of the first intermetal dielectric, the second intermetal dielectric, and the capping layer exposed in step (b);
(d) etching the sacrificial layer, the second intermetal dielectric, and the capping layer to form a trench;
(e) removing portions of the sacrificial layer remaining within the via and on the capping layer using an etchant composition consisting essentially of $NH_4F$, HF, $H_2O$ and a surfactant; and,
(f) forming an upper metal wiring within a dual damascene pattern including the via and the trench.

15. The method of claim 14, wherein the surfactant consists essentially of a material selected from the group consisting of perfluoroalkyl ethylene oxide, perfluoroalkyl amine oxide, perfluoroalkyl containing complexes, ammonium perfluoroalkyl sulfonates, potassium perfluoroalkyl sulfonates, amine perfluoroalkyl sulfonates, perfluoroalkyl sulfonates, sodium salts, potassium fluoroalkyl carboxylates, lithium perfluorooctane sulfonates, ammonium perfluoroalkyl sulfonates, fluorinated alkyl quaternary ammonium iodides, fluorinated alkyl polyoxethylenes, fluorinated alkyl alkoxylates, ammonium perfluoroalkyl carboxylates, fluoroaliphatic polymeric esters, alkylaryl polyether alcohol, polymer of ethylene oxide andnonylphenol, polymers of ethylene oxide and 2,6,8-trimethyl-4-nonanol, polymers of ethylene oxide and propylene oxide, R—O—S(=O)$_2$—ONa (wherein R is selected from tetradecyl, heptadecyl and 2-ethylhexyl groups), R—O—($C_2H_4O$)x-H, RfCH$_2$CH$_2$SCH$_2$CH$_2$CO$_2$Li (wherein Rf is a F(CF$_2$CF$_2$)$_{3~8}$ group), (RfCH$_2$CH$_2$O)PO(ONH$_4$)$_2$ (wherein Rf is a F(CF$_2$CF$_2$)$_{3~8}$ group), (RfCH$_2$CH$_2$O)PO(ONH$_4$) (wherein Rf is a F(CF$_2$CF$_2$)$_{3~8}$ group), (RfCH$_2$CH$_2$O)PO(OH)$_2$ (wherein Rf is a F(CF$_2$CF$_2$)$_{3~8}$ group), RfCH$_2$CH$_2$O(CH$_2$CH$_2$O)xH (wherein Rf is a F(CF$_2$CF$_2$)$_{3~8}$ group), RfCH$_2$CH$_2$SO$_3$X (wherein X is a H or NH$_4$ group and Rf is a F(CF$_2$CF$_2$)$_{3~8}$ group), CF$_3$(CF$_2$)$_7$(CH$_2$CH$_2$O)$_{15}$SO$_2$NHOH, RfSO$_2$N(C$_2$H$_5$)(CH$_2$CH$_2$O)xH (wherein N is 8 and Rf is a CnF2n+ group), RfSO$_2$N(C$_2$H$_5$)(CH$_2$CH$_2$O)xH (wherein Rf is a F(CF$_2$CF$_2$)y group), or combinations of these compounds.

16. The method of claim 15, wherein the surfactant is present in the etchant composition in an amount of about 0.1-5 wt % based on the weight of the etchant composition.

17. The method of claim 16, wherein $NH_4F$ is present in the etchant composition in an amount of about 5-25 wt %, HF is present in the etchant composition in an amount of about 0.01-3 wt %, and $H_2O$ is present in the etchant composition in an amount of about 70-95 wt %.

18. The method of claim 15, further comprising the step of forming a second etch stop layer between the first and second intermetal dielectrics before forming the second intermetal dielectric of the semiconductor.

19. The method of claim 18, wherein the first etch stop layer and/or the second etch stop layer consist essentially of a material selected from the group consisting of SiN, SiON, SiC/N-series material, boron nitride (BN), and combinations or mixtures thereof.

20. The method of claim 15, wherein the capping layer consists essentially of a material selected from the group consisting of $SiO_2$, SiOF, SiON, SiC, SiN, SiCN and combinations and mixtures thereof.

21. The method of claim 15, wherein the first and/or the second intermetal dielectrics consist essentially of a material selected from the group consisting of fluorine-doped oxide (FSG), carbon-doped oxide, silicon oxide, hydrogen silsesquioxane (HSQ) methyl silsesquioxane (MSQ) or a-SiOC (SiOC:H), polyarylether-based resin, annular fluorine resin, siloxane copolymer, polyarylether-based fluoride resin, polypentafluorostylene, polytetrafluorostylene-based resin, polyimide fluoride resin, polynaphthalene fluoride, polycide resin, and combinations or mixtures thereof.

22. The method of claim 15, wherein the first etch stop layer consists essentially of a material selected from the group consisting of SiN, SiON, SiC/N-series material, boron nitride (BN), and combinations or mixtures thereof.

23. The method of claim 14, wherein $NH_4F$ is present in the etchant composition in an amount of about 5-25 wt %, HF is present in the etchant composition in an amount of about 0.01-3 wt %, the surfactant is present in the etchant composition in an amount of about 0.1-5 wt. %, and $H_2O$ is present in the etchant composition in an amount of about 70-95 wt %.

24. The method of claim 14, wherein the step of removing the sacrificial layer is performed at a temperature of about 20-80° C.

25. The method of claim 14, wherein $NH_4F$ is present in the etchant composition in an amount of about 19 wt %, HF is present in the etchant composition in an amount of about 2 wt %, the surfactant is present in the etchant composition in an amount of about 0.1-5 wt. %, and $H_2O$ is present in the etchant composition in an amount of about 79 wt %.

* * * * *

UNITED STATES PATENT AND TRADEMARK OFFICE
CERTIFICATE OF CORRECTION

PATENT NO. : 7,598,168 B2
APPLICATION NO. : 11/033208
DATED : October 6, 2009
INVENTOR(S) : Han et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1250 days.

Signed and Sealed this

Twenty-eighth Day of September, 2010

David J. Kappos
*Director of the United States Patent and Trademark Office*